(12) United States Patent
Nakano

(10) Patent No.: US 7,472,387 B2
(45) Date of Patent: Dec. 30, 2008

(54) SYSTEM FOR SUPPLYING SEMICONDUCTOR MANUFACTURING SYSTEM CONTROL PROGRAMS

(75) Inventor: Minoru Nakano, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 558 days.

(21) Appl. No.: 10/050,101

(22) Filed: Jan. 18, 2002

(65) Prior Publication Data
US 2002/0111708 A1 Aug. 15, 2002

(30) Foreign Application Priority Data
Jan. 22, 2001 (JP) .............................. 2001-012829

(51) Int. Cl.
*G06F 9/45* (2006.01)
(52) U.S. Cl. ...................................... 717/174
(58) Field of Classification Search .................. 717/174
See application file for complete search history.

(56) References Cited

U.S. PATENT DOCUMENTS 5,970,243 A * 10/1999 Klein et al. ................. 717/113

2001/0029178 A1 * 10/2001 Criss et al. .................. 455/419
2003/0217257 A1 * 11/2003 Ebsen et al. ................. 713/100

FOREIGN PATENT DOCUMENTS

| JP | 10-301799 | 11/1998 |
| JP | 11-95811 | 4/1999 |
| KR | 1998-025897 | 7/1998 |
| KR | 1999-0038795 | 6/1999 |

OTHER PUBLICATIONS

Korean Office Action issued Mar. 31, 2008 in Korean Application No. 9-5-2008-018279999.

* cited by examiner

*Primary Examiner*—John Chavis
(74) *Attorney, Agent, or Firm*—Wenderoth, Lind & Ponack, L.L.P.

(57) ABSTRACT

A system for supplying a semiconductor manufacturing system control program includes an administrative server, a communications circuit connecting the administrative server to a controller of a semiconductor manufacturing system, a facility provided in the controller for determining a time when a previously installed control program can be changed, and a facility provided in the controller responsive to a result of the determination for storing a new control program received from the administrative server through the communications circuit in a memory to be executable by a processor.

12 Claims, 8 Drawing Sheets

SYSTEM FOR SUPPLYING SEMICONDUCTOR MANUFACTURING SYSTEM CONTROL PROGRAMS

BACKGROUND OF THE INVENTION

1. Field of the Invention

This invention relates to system technology for supplying a control program to a controller for controlling a semiconductor manufacturing system via a communications circuit, particularly to such a system that enables the control program to be installed without interfering with the operation of the semiconductor manufacturing system.

2. Description of the Prior Art

Semiconductor manufacturing systems are used to manufacture silicon substrates for semiconductor devices, glass substrates for LCDs (liquid crystal displays) and the like. In a CVD (chemical vapor deposition) system, for example, a silicon wafer substrate is placed in a heating furnace and a thin film, such as an oxide film or a nitride film, is formed on the substrate by supplying reaction gas into the heating furnace as the interior of the heating furnace is heated to a prescribed temperature.

Semiconductor manufacturing systems include batch systems that process a large number of substrates at one time and sheet-fed systems that process a single substrate or a number of substrates sequentially. FIGS. 6(a) and (b) show an example of a batch semiconductor manufacturing system as viewed from the side, and FIG. 7 shows an example of a sheet-fed semiconductor manufacturing system viewed from above.

The semiconductor manufacturing system shown in FIGS. 6(a) and (b) comprise a vertical reaction furnace composed of a vertically oriented furnace 2 heated by a heater 1. A boat 4 charged with a large number of substrates 3 is elevated into the furnace 2 and the substrates 3 are batch-processed. Specifically, the boat 4 charged with numerous substrates 3 is raised by an elevator 5, as shown at FIG. 6(a) in the drawing, so as to be accommodated and sealed in the furnace 2, as shown at FIG. 6(b). The interior of the furnace 2 is then heated to a prescribed temperature by the heater and supplied with reaction gas (not shown) to form a prescribed thin film on each of the substrates 3. The furnace temperature is then brought down and, as shown at FIG. 6(a), the elevator 5 is lowered to draw the boat 4 out of the furnace 2 and thus remove the substrates 3 formed with films.

After withdrawal of the boat 4, the temperature inside the furnace is generally maintained relatively high so that it can be rapidly raised to the prescribed reaction temperature when the next batch is processed.

The semiconductor manufacturing system shown in FIG. 7 has a polygonal main chamber 10, a robot arm 11 located inside the main chamber 10, and a number of sub-chambers 12a-12f arranged on substantially the same horizontal plane and each connected with one side of the main chamber 10. The robot arm 11 sequentially transfers substrates 13 to the sub-chambers 12a-12f for processing. The sub-chamber 12a serves as the station for feeding the substrates 13 in and out, and the other sub-chambers 12b-12f form preheating and reaction chambers. A substrate 13 introduced through the sub-chamber 12a is transferred by the robot arm 11, has a thin film formed on it in a reaction chamber, and the finished substrate 13 is transferred by the robot arm 11 and fed out of the sub-chamber 12a.

Each of the sub-chambers 12a-12f is equipped with a shutter 14 for air-tight sealing.

The manufacturer of such a semiconductor manufacturing system installs it for operation at a customer's semiconductor production plant. As shown in FIG. 8, a number of semiconductor manufacturing systems (#1-#n) are installed at the plant and the operation of each system is controlled by controllers. In the illustrated example, each semiconductor manufacturing system is equipped with a temperature controller 21 for controlling heating temperatures such as the temperature of the reaction chambers, a mechanism controller 22 for controlling operation of the elevator, robot arm and other mechanical sections, a pressure controller 23 for controlling pressures such as the reaction pressure of the reaction chambers, and a gas controller 24 for controlling the flow of gas supplied to the reaction chambers and the like. A main controller 25 is provided for centralized control of the controllers 21-24 via a LAN or other communications circuit 26. In addition, a block controller 27 is provided for centralized control of the main controllers 25 of the semiconductor manufacturing systems at the plant via a LAN or other communications circuit 28.

The controllers 21-24, 25 and 27 are constituted as computers that execute prescribed control and processing by executing appropriate control programs using a processor, memory and other hardware resources.

These programs are, for example, stored in hard disk memories of the controllers. Otherwise the controllers are equipped with ROMs in which the programs are stored in advance.

As it is occasionally necessary to upgrade a controller or rid its control program of a bug, the control program loaded in the controller has to be modified from time to time. This need arises relatively frequently when a new plant is ramped up.

Up to now in such cases, a technician from the semiconductor manufacturing system manufacturer has had to visit the customer's plant to install a new control program in the controller concerned or replace its ROM.

This is disadvantageous first because it is a labor-intensive and time-consuming method that involves considerable cost and second because it requires the semiconductor manufacturing system to be temporarily shut down, with the risk of lowering the system capacity utilization.

This invention was accomplished in light of the foregoing circumstances and has as an object to provide a system that enables installation of a control program in a semiconductor manufacturing system by transmission over a communications circuit without interfering with the operation of the semiconductor manufacturing system.

Other objects of the present invention will become apparent from the following explanation.

Unexamined Japanese patent application JP-A-10-301799 teaches a system for testing systems that sends a diagnostic program from a host computer to a system to be diagnosed at times when the probability of a malfunction occurring is considered highest based on a frequency function of malfunction occurrence.

Unexamined Japanese patent application JP-A-11-95811 teaches a system that at the time of replacing a controller uses a maintenance facility to check whether the controller is operational and, if not, operates it by sending application data and constant data.

These prior art technologies share a common element with the present invention only in the point that they also deliver programs and/or data to a remote location. However, they are directed to preventing trouble from occurring in the operation of a semiconductor system and, as such, differ totally from the present invention in the problem to be solved and the means for solving the problem.

SUMMARY OF THE INVENTION

The present invention achieves the foregoing objects by providing a system for supplying a semiconductor manufacturing system control program comprising an administrative server, a communications circuit connecting the administrative server to a controller of a semiconductor manufacturing system, a facility provided in the controller for determining a time when a previously installed control program can be changed, and a facility provided in the controller responsive to a result of the determination for storing a control program received from the administrative server through the communications circuit in a memory so as to be executable by a processor. The system for supplying semiconductor manufacturing system control programs of this configuration can automatically install the control program supplied from the administrative server through the communications circuit in the controller in place of the existing control program without interfering with the operation of the semiconductor manufacturing system.

The time when the control program can be changed can, for example, be set to a time when the operation of the semiconductor manufacturing system itself is standing by or suspended, such as in a standby state immediately after power-on, a time when a heater is standing by at a constant temperature, such as when a reaction chamber is in a standby state, and a temperature controller is not performing any particular control, a time when a robot arm or elevator is stopped and a mechanism controller is not performing any particular control, a time when processing is not being conducted in a reaction chamber and a pressure controller is not performing any particular control or a time when gas is not being supplied to a reaction chamber and a gas controller is not performing any particular control, i.e., can be set to a time when the controller to be supplied the control program is not engaged in control processing.

In a semiconductor manufacturing system, the process for growing a film on a substrate under processing is extremely critical from the aspect of product quality. In the present invention, therefore, excellent quality of the substrate constituting the product is assured, particularly by not determining a time when the semiconductor manufacturing system is performing a process event for growing a film on a substrate under processing as a time when the control program can be changed.

In another aspect, the present invention provides a system for supplying a semiconductor manufacturing system control program comprising an administrative server, a communications circuit connecting the administrative server to a controller of a semiconductor manufacturing system, a facility provided in the controller for receiving input of a control program change instruction from a user of the semiconductor manufacturing system, and a facility provided in the controller responsive to a control program change instruction for storing a control program received from the administrative server through the communications circuit in a memory to be executable by a processor. The system for supplying semiconductor manufacturing system control programs of this configuration can, in response to an operation performed by the user of the semiconductor manufacturing system, store the control program supplied from the administrative server through the communications circuit in the controller in place of the existing control program, thereby installing the control program in the controller without interfering with the operation of the semiconductor manufacturing system.

In another aspect, the present invention provides a system for supplying semiconductor manufacturing system control programs comprising an administrative server, a communications circuit connecting the administrative server to a controller of a semiconductor manufacturing system, a facility provided in the controller for receiving input of a control program change instruction from the administrative server through the communications circuit; and a facility provided in the controller responsive to a control program change instruction for storing a control program received from the administrative server through the communications circuit in a memory to be executable by a processor. The system for supplying semiconductor manufacturing system control programs of this configuration can automatically supply the control program to the controller through the communications circuit under the direction and management of the administrative server without interfering with the operation of the semiconductor manufacturing system.

If the administrative server is kept constantly informed of the operating state of the semiconductor manufacturing, the control program can be automatically installed at a time when the control program can be changed.

Preferably, the system for supplying semiconductor manufacturing system control programs according the present invention is further provided in the controller with a buffer for temporarily storing the control program received from the administrative server through the communications circuit and the control program stored in the buffer is stored in the memory in response to a determination result or an instruction. As this enables the processing time to be divided between a time suitable for transmitting the control program over the communications circuit and a time suitable for storing the control program, it ensures that the supply and installation of the control program does not require a long continuous period of time and, by this, avoids interfering with the operation of the semiconductor manufacturing system for a long period of time to the utmost possible.

Preferably, the system for supplying semiconductor manufacturing system control programs according to the present invention is further provided in the controller with a facility for retaining existing data used to execute the replaced control program and the processor executes the new control program stored in memory using the existing data. Since this enables the new control program to control the controller with no change in the temperature conditions, pressure conditions and other various semiconductor production conditions, it ensures that the semiconductor production processing can maintain the same quality as in the past, unaffected by condition changes that may have a critical effect on product quality even when slight.

In another aspect, the present invention provides a method for supplying a semiconductor manufacturing system control program of the type executed by a system described above through a communications circuit to a controller for controlling operation of a semiconductor manufacturing system by executing a control program, the method comprising transmitting a control program from an administrative server or other supply source through a communications circuit to a controller of the semiconductor manufacturing system and, effected at a time when the semiconductor manufacturing system is in an operating state permitting a previously installed control program to be changed, storing the transmitted control program so as to be executable by the controller.

In another aspect, the present invention provides a method for supplying a semiconductor manufacturing system control program of the type executed by a system described above through a communications circuit to a controller for controlling operation of a semiconductor manufacturing system by executing a control program, the method comprising transmitting a control program from an administrative server or other supply source through a communications circuit to a controller of the semiconductor manufacturing system and executing the transmitted new control program in the controller using data used to execute an old control program.

In another aspect, the present invention provides an administrative server of a type that can be incorporated in a system described above, the administrative server comprising a facility for transmitting a control program through a communications circuit to a controller for, at a time when the semiconductor manufacturing system is in an operating state permitting a previously installed control program to be changed, storing the received control program in a memory of the controller to be executable by the controller.

In another aspect, the present invention provides an administrative server for a semiconductor manufacturing system control program of a type that can be incorporated in a system described above, the administrative server comprising a facility for transmitting a control program through a communications circuit to a controller for enabling the controller to execute the received new control program using data used to execute an old control program.

In another aspect, the present invention provides a semiconductor manufacturing system controller that can be incorporated in a system described above, the controller comprising a facility for determining a time when a previously installed control program can be changed and a facility responsive to a result of the determination for storing a control program received through a communications circuit in a memory to be executable by a processor.

In another aspect, the present invention provides a semiconductor manufacturing system controller that can be incorporated in a system described above, the controller comprising a facility for retaining existing data used to execute a replaced control program and a facility for executing a new control program received through a communications circuit using the existing data

DESCRIPTION OF THE PREFERRED EMBODIMENTS

Figure 6:
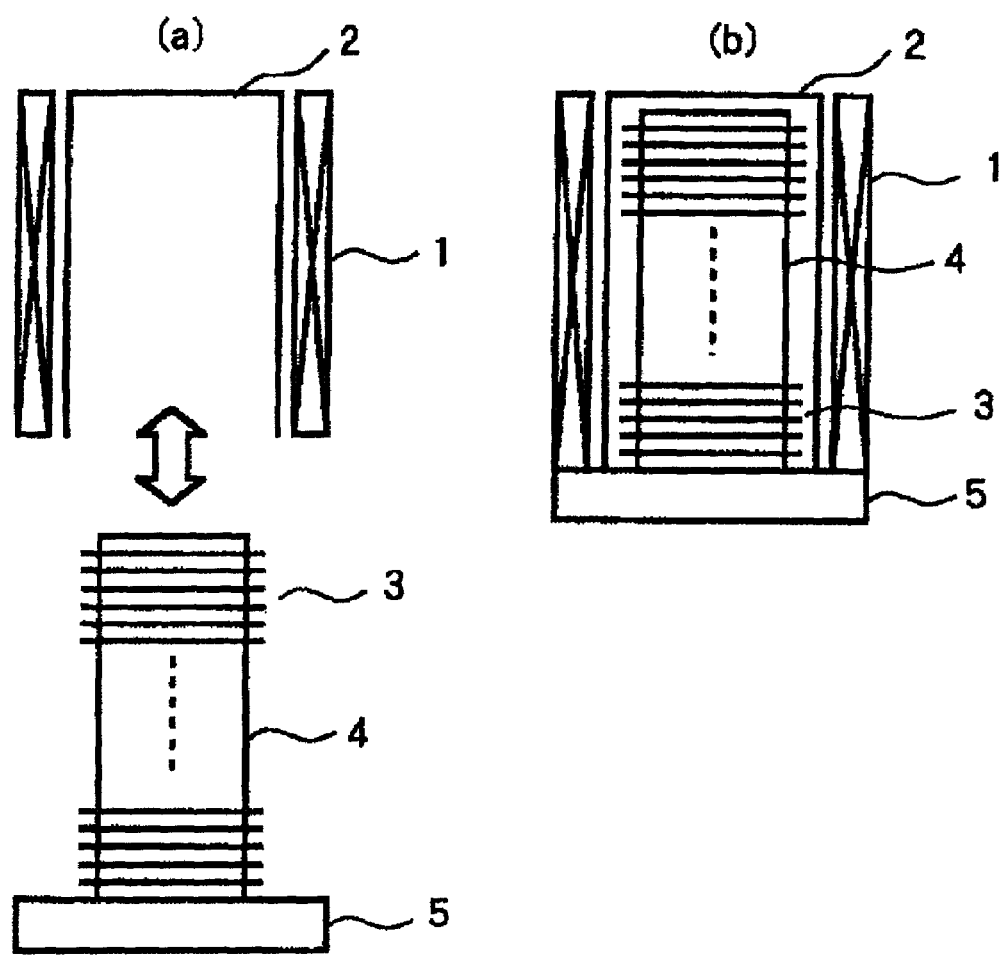
FIG. 6 is a schematic sectional side view of a vertical semiconductor manufacturing system.
Figure 7:
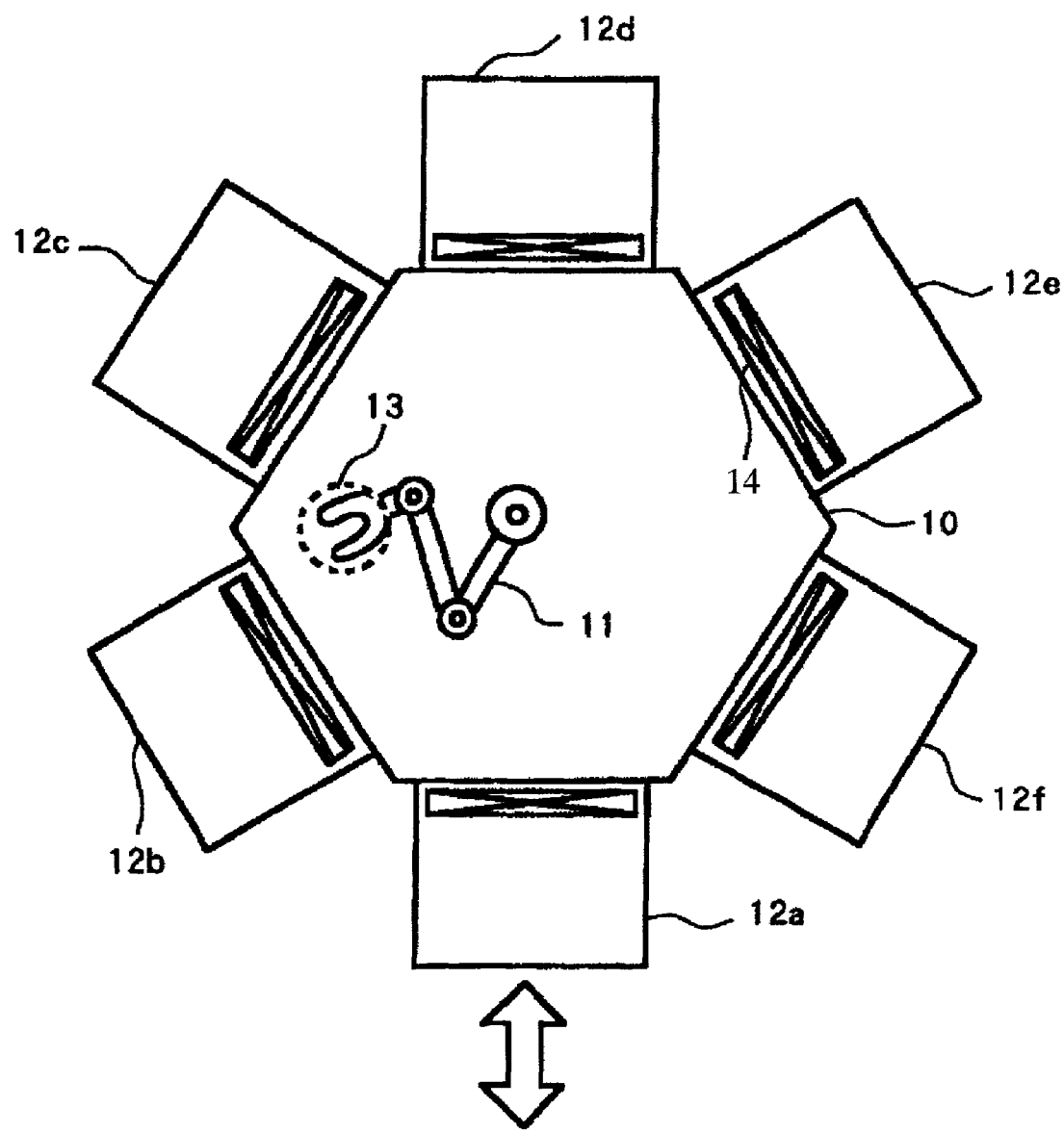
FIG. 7 is a schematic top view of a sheet-fed semiconductor manufacturing system.
Figure 8:
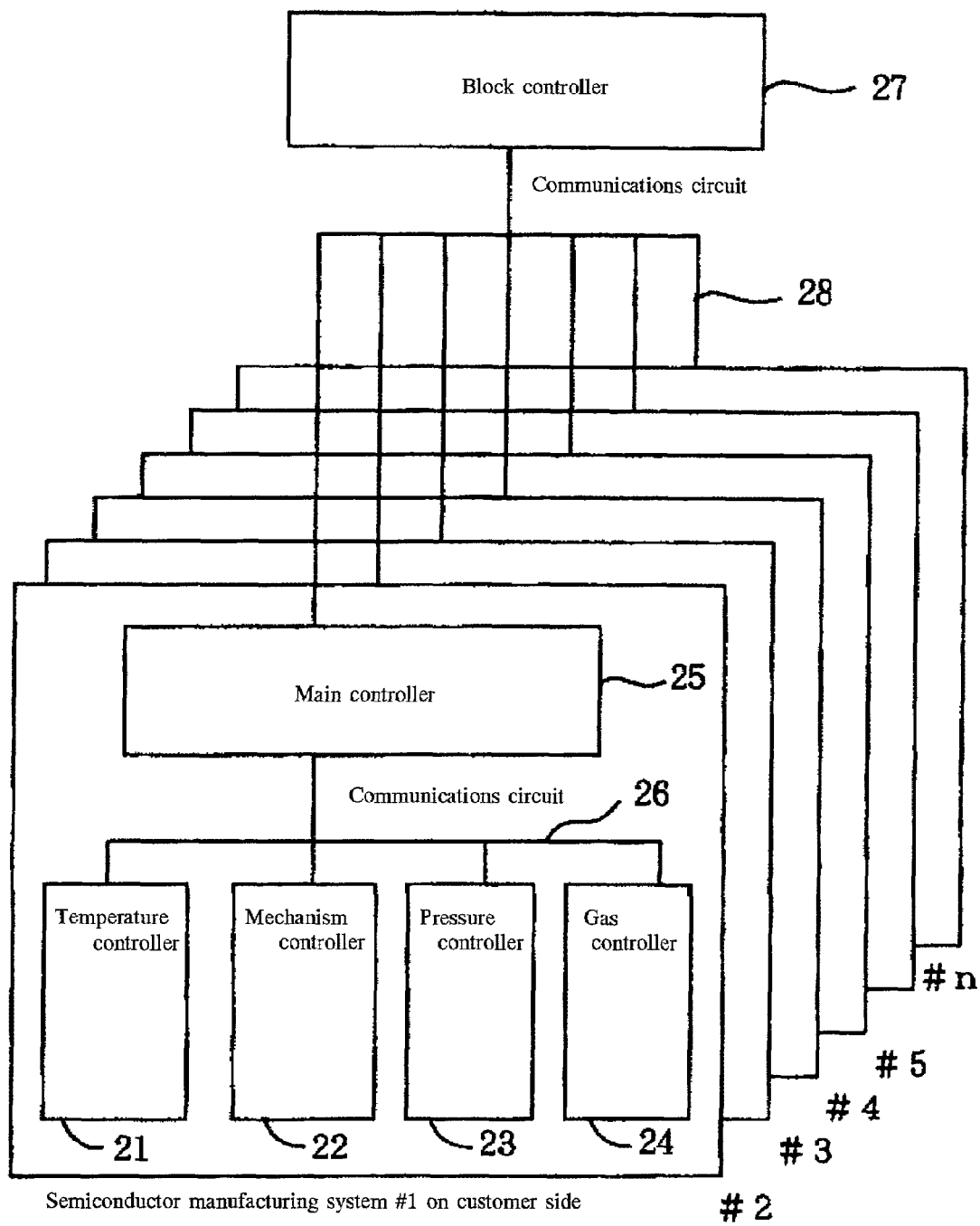
FIG. 8 is diagram showing a semiconductor manufacturing system control system.

An embodiment of the present invention, applicable to the control system of a vertical semiconductor manufacturing system such as shown in FIG. 6, will now be explained with reference to the drawings.

Figure 1:
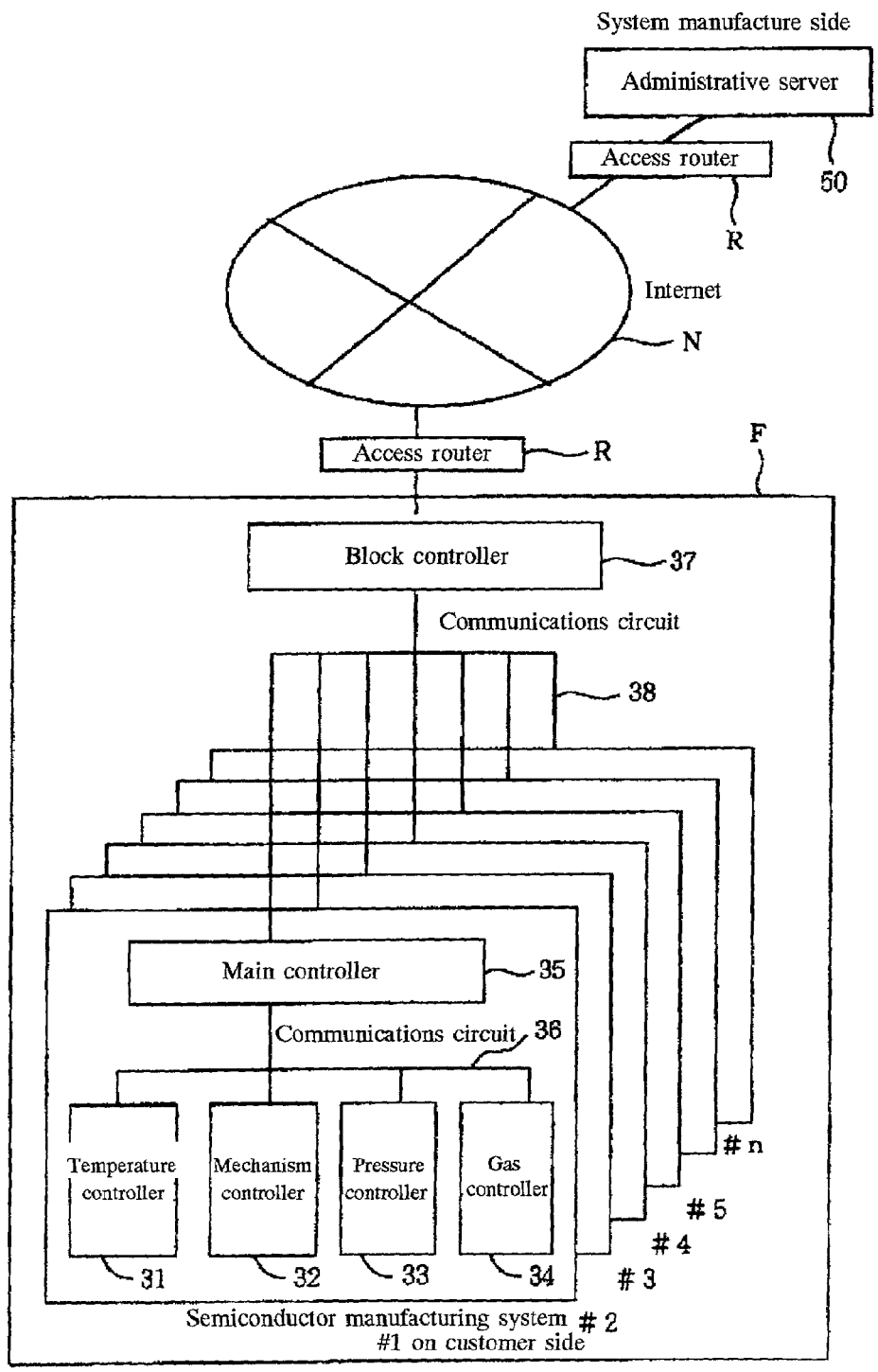
FIG. 1 is a diagram showing a system for supplying semiconductor manufacturing system control programs that is an embodiment of the present invention.

FIG. 1 shows the overall configuration of the system for supplying semiconductor manufacturing system control programs of this embodiment. A number of semiconductor manufacturing systems (vertical semiconductor manufacturing systems #1-#n) installed at a customer semiconductor manufacturing plant F each have their operation controlled by a respective number of controllers.

Each semiconductor manufacturing system (#1-#n) is equipped with a temperature controller 31 for controlling the heating temperature by a heater 1, a mechanism controller 32 for controlling operation of an elevator 5, a pressure controller 33 for controlling the pressure of a reaction furnace 2, and a gas controller 34 for controlling the flow of gas supplied to the reaction furnace 2. A main controller 35 is provided for centralized control of the controllers 31-34 via a LAN or other communications circuit 36. In addition, a block controller 37 is provided for centralized control of the main controllers 35 of the semiconductor manufacturing systems at the plant F via a LAN or other communications circuit 38.

The controllers 31-34, 35 and 37 are constituted as computers that execute prescribed control and processing by executing appropriate control programs using a processor, memory and other hardware resources.

These programs are, for example, readably/writably stored in hard disk memories of the controllers, and the controllers execute prescribed control and processing in accordance with the control programs.

The block controller 37 is connected to a communications circuit (the Internet) N through an access router R, and a PC (administrative server 50) installed on the side of the manufacturer of the semiconductor manufacturing system is connected to the Internet N through another access router R.

In other words, the block controller 37 installed at the plant F, and the main controller 35 and the different functional component controllers 31-34 under it, are connected to the PC 50 managed by the manufacturer of the semiconductor manufacturing system through the network N.

Figure 2:
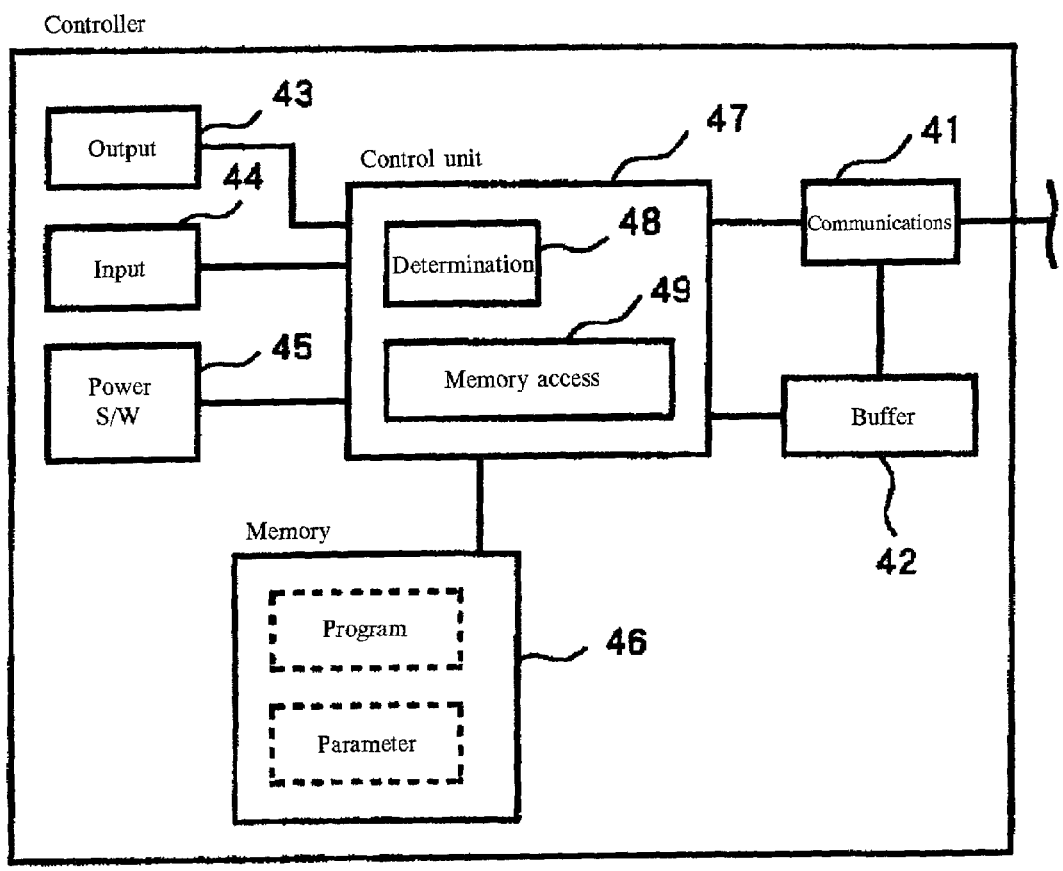
FIG. 2 is a diagram showing a controller that is an embodiment of the present invention.

FIG. 2 shows the configuration of one of the controllers. The block controller 37, main controller 35 and controllers 31-34 are similarly configured.

Each controller has a communications unit 41 that processes data transactions over the network N and the communications circuits 36 and 37, a buffer 42 that temporarily retains transmitted and received data and programs, an output unit 43 that presents information to an operator in visible form by, for instance, displaying it on a screen or printing it with a printer, an input unit 44 that receives input from the operator through operation buttons, a keyboard or the like, a power switch 45 for turning the main power supply to the controller ON and OFF, a memory 46 that readably/writably stores a program for operational control of the controller proper, a program for controlling functional components of the semiconductor manufacturing system thereunder (heater, elevator or the like) and parameters used to execute the control programs, and a control unit 47 that controls the foregoing functional components 41-46 and performs prescribed control and processing.

The control unit 47 is constituted as a processor that controls the functional components 41-46 of the controller by executing programs stored in the memory 46. The control unit 47 also implements a determining unit or facility 48 that checks whether a control program can be changed and a storage or memory access unit or facility 49 that controls writing and reading to and from the memory 46.

As explained later, in an alternative embodiment of the present invention, the determining facility 48 is omitted and determination of a time when the control program can be changed is left up to the operator or the administrative server 50.

Figure 3:
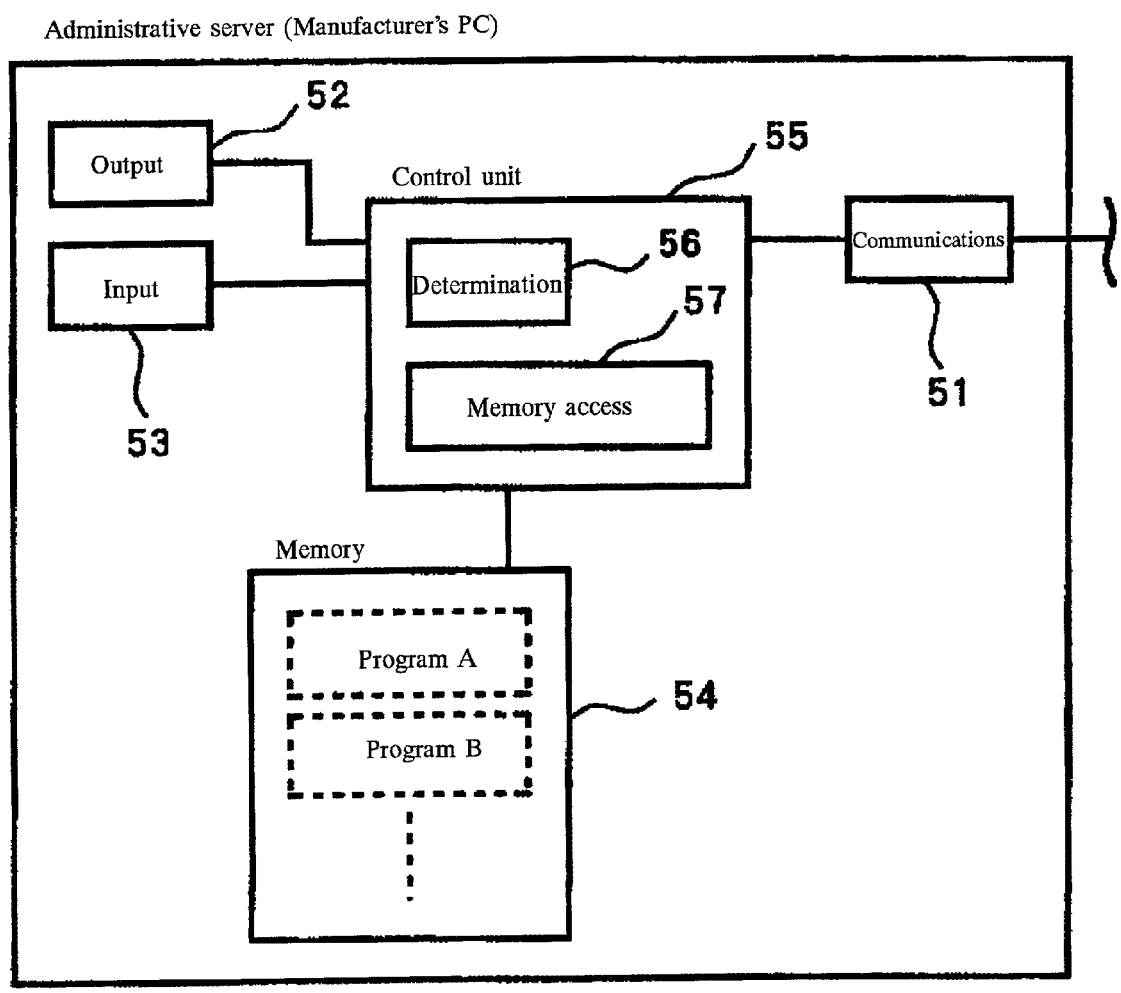
FIG. 3 is a diagram showing an administrative server that is an embodiment of the present invention.

FIG. 3 shows the configuration of the administrative server (manufacturer's PC) 50.

The administrative server 50 has a communications unit 51 that processes data transactions over the network N, an output unit 52 that presents information to an operator in visible form by, for instance, displaying it on a screen or printing it with a printer, an input unit 53 that receives input from the operator through operation buttons, a keyboard or the like, a memory 54 that readably/writably stores a program for operational control of the administrative server proper, programs A, B . . . for transmission to controllers thereunder, and a control unit 55 that controls the foregoing functional components 51-54 and performs prescribed control and processing.

The control unit 55 is constituted as a processor that controls the functional components 51-54 of the administrative server by executing programs stored in the memory 54. The control unit 55 also implements a determining unit or facility 56 that checks whether controller control programs can be changed and a storage or memory access unit or facility 57 that controls writing and reading to and from the memory 54.

As explained further later, in an alternative embodiment of the present invention, the determining facility 56 is omitted and determination of times when control programs can be changed is left up to the operator or the controllers 31-34, 35 and 37.

The method of supplying control programs according to the present invention will now be explained. Program supply is performed in one of five modes depending on the entity that determines the time for changing the control program.

In the first mode, the time for changing the control program is determined by the individual component controllers 31-34. In this case, the other controllers 35, 37 and the administrative server 50 do not need to be equipped with a determining facility.

Specifically, in the first mode, each of the component controllers 31-34 determines, based on the operating state of its functional components, when the control program can be changed to a new one and stores a control program received from the administrative server 50 through the communications circuit in the memory 46 to be executable by the control unit 47.

In the second mode, the time for changing the control program is determined by the main controller 35. In this case, the other controllers 31-34, 37 and the administrative server 50 do not need to be equipped with a determining facility.

Specifically, in the second mode, the main controller 35 determines, based on the operating state of the functional components controlled by the component controllers 31-34, when its own control program and the control program of each of the component controllers 31-34 can be changed to a new one and stores a control program received from the administrative server 50 through the communications circuit in its own memory 46 or the memory 46 of the controller 31-34 concerned to be executable by the associated control unit 47.

In the third mode, the time for changing the control program is determined by the block controller 37. In this case, the other controllers 31-34, 35 and the administrative server 50 do not need to be equipped with a determining facility.

Specifically, in the third mode, the block controller 37 determines, based on the operating state of the functional components controlled by the component controllers 31-34, when its own control program, the control program of the main controller 35 and the control program of each of the component controllers 31-34 can be changed to a new one and stores a control program received from the administrative server 50 through the communications circuit in its own memory 46 or the memory 46 of the main controller 35 or component controller 31-34 concerned to be executable by the associated control unit 47.

In the fourth mode, the time for changing the control program is determined by the block administrative server 50. In this case, the controllers 31-34, 35 and 37 do not need to be equipped with a determining facility.

Specifically, in the fourth mode, information regarding the operating state of the functional components of the semiconductor manufacturing system is sent to and managed by the administrative server 50, and the administrative server 50 determines when the control program of the block controller 37, main controller 35 and each component controller 31-34 can be changed to a new one, and transmits control programs through the communications circuit to be stored in appropriate ones of the memories 46 of the block controller 37, the main controller 35 and the component controllers 31-34 to be executable by the associated control unit 47.

In the fifth mode, the time for changing the control program is determined by the operator of the semiconductor manufacturing system. In this case, the controllers 31-34, 35, 37 and the administrative server 50 do not need to be equipped with a determining facility.

Specifically, in the fifth mode, information regarding the operating state of the functional components of the semiconductor manufacturing system is managed by the operator, the operator uses the input unit 44 to input a change instruction at the time when the control program of the block controller 37, main controller 35 or one of the component controllers 31-34 can be changed to a new one, and the administrative server 50 transmits a control program through the communications circuit to be stored in the memory 46 of the block controller 37, the main controller 35 or the component controller 31-34 concerned to be executable by the associated control unit 47.

In each of these five modes according to the present embodiment, existing parameters such as temperature change rate, gas flow rate and the like used to execute the old control program (the control program to be replaced) are retained in the memory 46 at the time of switching over to the received new control program and the control unit 47 uses these existing parameters to execute the new control program stored in the memory 46. Therefore, even when control performance is enhanced by upgrading the control program to a new version or when a control program problem is overcome by eliminating a bug, the semiconductor manufacturing system can continue to manufacture products under the same conditions as before.

Alternatively, parameters can be supplied together with the control program without retaining the existing parameters.

The foregoing first embodiment, which is a typical embodiment of the present invention, will now be explained in further detail taking as an example the temperature controller 31 that controls the heater 1 of the vertical semiconductor manufacturing system.

Figure 4:
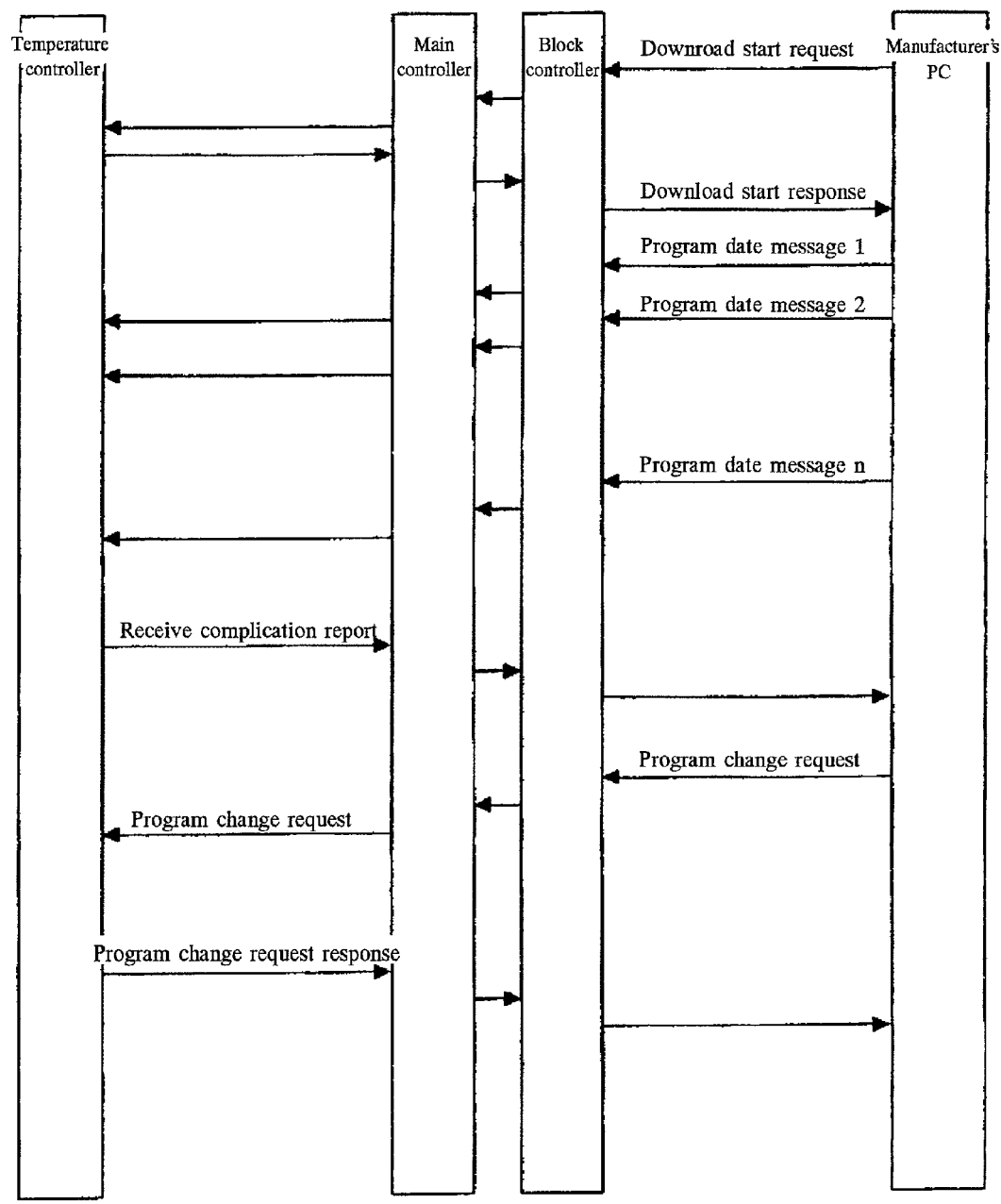
FIG. 4 is a diagram showing a control program download procedure according to the present invention.

The sequence of the procedures for downloading a new control program to the temperature controller 31 is illustrated in FIG. 4.

Figure 5:
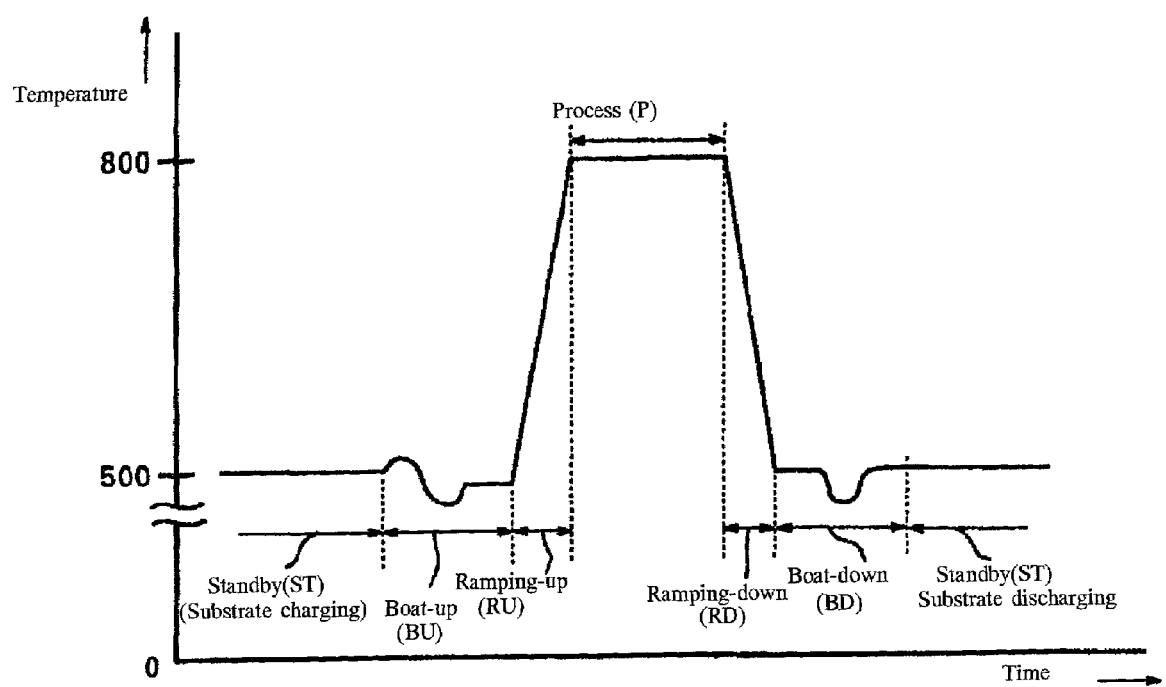
FIG. 5 is a diagram showing temperature characteristics in a semiconductor manufacturing system.

An example of the temperature characteristics of the reaction furnace 2 under heating by the heater 1 in the vertical semiconductor manufacturing system is shown in FIG. 5. Heating by the heater 1 under the control of the temperature controller 31 so as to achieve these temperature characteristics enables the processed substrates to be produced with the desired quality.

The temperature regions that particularly affect the quality of the substrates are those of the process event P when a film is grown on the substrate, the latter half of the ramping-up RU when the temperature is gradually raised, and the first half of the ramping-down event RD when the temperature is gradually lowered. The determining facility 48 of the temperature controller is set in advance so as not to carry out a control program change during these event periods.

Thus the times when the determining facility 48 determines that change to a new control program is possible are during standby event ST when substrates are charged into the boat 4, boat-up event BU when the elevator 5 is raised to charge the elevator 5 into the reaction furnace 2, the first half of the ramping-up event RU event, the latter half of the ramping-down event RD when the temperature is gradually lowered, the boat-down event when the elevator 5 is lowered to draw the elevator 5 out of the reaction furnace 2, and the standby event ST when substrates are discharged from the boat 4.

Product quality degradation is thus prevented by ensuring that change of the control program does not cause temperature variation at least in temperature regions that include process events that have the greatest effect on substrate processing.

As indicated by the sequence in FIG. 4, the download sequence starts with the manufacturer's PC (administrative server) 50 transmitting a new control program download start request to the target temperature controller 31 over the network N. The request is received by the temperature controller 31 via the block controller 37, main controller 35 and communications circuit 36.

In response, the temperature controller 31 transmits a download start response, which is received by the manufacturer's PC 50, the source of the request, via the communications circuit 36, main controller 35, communications circuit 38, block controller 37 and network N.

The download can be made without regard to the "time when the control program can be changed" discussed earlier. The transmission of the download start response is initiated by the control unit 47 or an instruction of the operator.

Upon receiving the download start response, the memory access facility 57 of the manufacturer's PC 50 reads the control program to be transmitted from the memory 54, and the communications unit 51 divides the control program into a number of message data in conformity with the communications format and sequentially transmits the message data over the network N to the target temperature controller 31.

The communications unit 41 of the temperature controller 31 receives the message data via the block controller 37, communications circuit 38, main controller 35 and communications circuit 36, stores them in the buffer 42, and, after all message data of the series have been received and stored in the buffer 42, sends a receive completion report to the manufacturer's PC 50 through the same communications path.

In response to the receive completion report, the manufacturer's PC 50 transmits a transmitted control program change request to the target temperature controller 31 over the network N and the target temperature controller 31 receives the request via the aforesaid communications path.

In the temperature controller 31, the determining facility 48 determines the change time as explained earlier and, at the determined "change-possible" time, the memory access facility 49 overwrites the old control program in the memory 46 with the new control program included in the message data retained in the buffer 42, thereby making it possible for the processor of the control unit 47 to execute the new control program using the existing parameters stored in the memory 46. At the time of the program storage, the temperature controller 31 sends the manufacturer's PC 50 a program change response through the aforesaid communications path so as to inform the manufacturer's PC 50 that the new control program was written in place of the old one.

While only the download in the case of a temperature controller was explained in the foregoing example, it will be easily understood a control program can be similarly downloaded from the administrative server side to any of the other component controllers, the main controllers and the block controller, and can also be similarly downloaded to controllers provided in a sheet-fed semiconductor manufacturing system.

Since, as explained in the foregoing, the present invention enables a control program to be supplied to a controller of a semiconductor manufacturing system from a remote location without interfering with the operation of the semiconductor manufacturing system, the cost and time the manufacturer spends on maintenance can therefore be greatly reduced without the lowering semiconductor manufacturing system capacity utilization or degrading product quality.

What is claimed is:

1. A semiconductor manufacturing system for producing a substrate to be treated, said system comprising:
   a controller for controlling operation of the semiconductor manufacturing system by carrying out a control program that is stored in memory, said controller being configured to determine a time when a previous downloaded control program can be changed, temporarily store a new control program received through a communications circuit in a buffer, and store the new control program received through the communications circuit and stored in the buffer in memory so as to be executable by a processor in response to said controller determining the time when the previous control program can be changed or in response to an instruction, wherein said previous control program and said new control program are operable to carry out the following events:
   a standby event charging a substrate in a boat;
   a boat-up event loading the boat in a reactor by raising an elevator;
   a ramping-up event gradually raising a temperature;
   a process event forming a film on the substrate;
   a ramping-down event gradually decreasing the temperature;
   a boat-down event drawing the boat from the reactor by lowering the elevator; and
   a standby event discharging the substrate from the boat;
   wherein said controller is further configured to determine that the time at which the control program can be changed is not the process event forming a film on the substrate; and
   wherein said controller is further configured to hold prior data that was used to carry out the previous control program so that the prior data is used in carrying out the new control program.

2. The semiconductor manufacturing system according to claim 1, wherein said controller is configured to change the control program while the temperature is in a constant state with the reaction chamber in a standby state.

3. The semiconductor manufacturing system according to claim 1, wherein said controller is configured to change the control program during the standby event for charging the substrate to the boat.

4. The semiconductor manufacturing system according to claim 1, wherein said controller is configured to change the control program during the boat-up event for loading the boat in a reactor by raising an elevator.

5. The semiconductor manufacturing system according to claim 1, wherein said controller is configured to change the control program during a boat-down event for drawing the boat from the reactor by lowering the elevator.

6. The semiconductor manufacturing system according to claim 1, wherein said controller is configured to change the control program during a standby event for discharging the substrate from the boat.

7. The semiconductor manufacturing system according to claim 1, wherein said controller is configured to change the control program while the temperature is in a constant state with the reaction chamber in a standby state.

8. The semiconductor manufacturing system according to claim 1, wherein said controller is configured to change the control program during the standby event for charging the substrate to the boat.

9. The semiconductor manufacturing system according to claim 1, wherein said controller is configured to change the control program during the boat-up event for loading the boat in a reactor by raising an elevator.

10. The semiconductor manufacturing system according to claim 1, wherein said controller is configured to change the control program during a boat-down event for drawing the boat from the reactor by lowering the elevator.

11. The semiconductor manufacturing system according to claim 1, wherein said controller is configured to change the control program during a standby event for discharging the substrate from the boat.

12. A semiconductor manufacturing system for producing a substrate to be treated, said system comprising:
   a boat for having a substrate charged therein;
   a reactor for processing the substrate and forming a film on the substrate;
   an elevator for raising and loading said boat into said reactor;
   a processor for carrying out a control program;
   a buffer for temporarily storing the control program;
   memory for storing the control program so that the control program can be carried out by said processor;
   a communications circuit for receiving a new control program;
   a controller for controlling operation of the semiconductor manufacturing system by carrying out the control program that is stored in said memory, said controller being configured to determine a time when a previous downloaded control program can be changed, temporarily store the new control program received through said communications circuit in said buffer, and store the new control program received through said communications circuit and stored in said buffer in said memory so as to be executable by said processor in response to said controller determining the time when the previous control program can be changed or in response to an instruction, wherein both of said previous control program and said new control program are operable to carry out the following events:
      a standby event charging the substrate in said boat;
      a boat-up event loading said boat in said reactor by raising said elevator;
      a ramping-up event gradually raising a temperature in said reactor;
      a process event forming a film on the substrate;
      a ramping-down event gradually decreasing the temperature;
      a boat-down event drawing said boat from said reactor by lowering said elevator; and
      a standby event discharging the substrate from said boat;
   wherein said controller is further configured to determine that the time at which the control program can be changed is not the process event forming a film on the substrate; and
   wherein said controller is further configured to hold prior data that was used to carry out the previous control program so that the prior data is used in carrying out the new control program.

* * * * *